United States Patent
Sato et al.

(10) Patent No.: US 7,348,122 B2
(45) Date of Patent: Mar. 25, 2008

(54) PHOTOSENSITIVE RESIN COMPOSITION AND METHOD FOR MANUFACTURING SEMICONDUCTOR DEVICE USING THE SAME

(75) Inventors: Kenichiro Sato, Shizuoka (JP); Tsukasa Yamanaka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/511,375

(22) Filed: Aug. 29, 2006

(65) Prior Publication Data

US 2007/0048656 A1    Mar. 1, 2007

(30) Foreign Application Priority Data

Aug. 29, 2005  (JP)  ............ P.2005-247407

(51) Int. Cl.
*G03F 7/023* (2006.01)
*G03F 7/30* (2006.01)

(52) U.S. Cl. ............ 430/190; 430/191; 430/192; 430/193; 430/326; 430/330

(58) Field of Classification Search ........ 430/165, 430/191, 192, 193, 326, 330, 190
See application file for complete search history.

(56) References Cited

U.S. PATENT DOCUMENTS 4,371,685 A   2/1983  Ahne et al.
6,127,086 A * 10/2000 Waterson et al. ......... 430/190
6,177,225 B1 * 1/2001 Weber et al. ............. 430/190
6,214,516 B1 * 4/2001 Waterson et al. ......... 430/191

FOREIGN PATENT DOCUMENTS

JP   2002-526795 A   8/2002

* cited by examiner

*Primary Examiner*—John S. Chu
(74) *Attorney, Agent, or Firm*—Sughrue Mion, PLLC

(57) ABSTRACT

A photosensitive resin composition comprising: a quinone diazide sulfonic acid ester of a phenol compound represented by formula (I) as defined in the specification; and a polybenzoxazole precursor, and a method for manufacturing a semiconductor device using the same

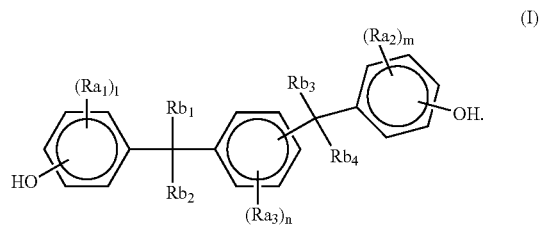

(I)

8 Claims, No Drawings

PHOTOSENSITIVE RESIN COMPOSITION AND METHOD FOR MANUFACTURING SEMICONDUCTOR DEVICE USING THE SAME

BACKGROUND OF THE INVENTION

1. Field of the Invention

The present invention relates to a photosensitive resin composition, and more particularly to a positive photosensitive resin composition suitable for application in the field of micro electronics and developable with an aqueous alkaline solution and a method for manufacturing a semiconductor device using the composition.

2. Description of the Related Art

In the application of micro electronics, polymers showing durability at high temperature are generally widely known. Precursors of polymers such as polyimides and polybenzoxazoles (PBO) can be made photoreactive with suitable additives. These precursors are converted to desired polymers by known techniques such as exposure to high temperature. Accordingly, in order to manufacture protective layers, heat insulating layers and relief structures of highly heat-resistant polymers, the polymer precursors have been used.

U.S. Pat. No. 4,371,685 discloses a positive photosensitive resin composition comprising an alkali-soluble PBO precursor and a diazoquinone photoactive compound. The diazoquinone compound prevents the PBO precursor from being dissolved in an aqueous salt. After exposure, the diazoquinone compound is photolyzed, and converted to an indene carboxylic acid which accelerates dissolution of the PBO precursor in an alkaline developing solution.

Further, JP-T-2002-526795 (the term "JP-T" as used herein means a published Japanese translation of a PCT patent application) discloses a composition comprising a PBO precursor partially capped with a diazoquinone compound.

The photosensitive resin composition comprising such a PBO precursor is a system in which it is difficult to obtain the sufficient difference in the rate of dissolution between an unexposed area and an exposed area, and there is a problem with regard to image performances such as sensitivity, film loss and resolution. Further, in a process in which heat curing is performed at about 300° C. after pattern formation, coloration occurs in some cases. This coloration poses a problem in a subsequent packaging process.

SUMMARY OF THE INVENTION

There are provided a photosensitive resin composition from which a relief structure having heat resistance is manufacturable and which can reduce film loss at the time of development and the problem of coloration at the time of heat curing, and a method for manufacturing a semiconductor device using the compound.

The above-mentioned problems has been solved by the following constitutions:

(1) A photosensitive resin composition comprising:
a quinone diazide sulfonic acid ester of a phenol compound represented by formula (I); and
a polybenzoxazole precursor:

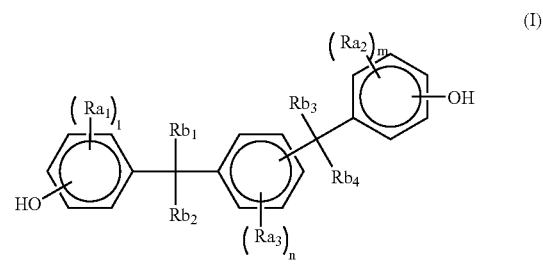

(I)

wherein $R_{a1}$ to $R_{a3}$ each independently represents an alkyl group, a cyclic alkyl group, an aryl group, an aralkyl group, an alkoxy group, a halogen atom, an acyl group, an acyloxy group, an alkoxycarbonyl group or an alkenyl group;

$R_{b1}$ to $R_{b4}$ each independently represents an alkyl group, and $R_{b1}$ and $R_{b2}$, or $R_{b3}$ and $R_{b4}$ may combine with each other to form a ring; and l, m and n each independently represents an integer of from 0 to 3.

(2) The photosensitive resin composition as described in (1) above,
wherein the polybenzoxazole precursor is a polybenzoxazole precursor polymer (G) having a following structure:

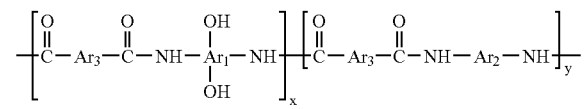

(G)

wherein $Ar_1$ is a tetravalent aromatic group, an aliphatic group or a heterocyclic group or a mixed group thereof;

$Ar_2$, which may contain silicon or not, is a bivalent aromatic group, a heterocyclic group, an alicyclic group or an aliphatic group;

$Ar_3$ is a bivalent aromatic group, an aliphatic group or a heterocyclic group or a mixed group thereof;

x represents 5 to 1000; and y represents 0 to 900.

(3) The photosensitive resin composition as described in (2) above,
wherein the polybenzoxazole precursor is a polybenzoxazole precursor (F) obtained by reacting the polybenzoxazole precursor polymer (G) with a diazoquinone to partially cap hydroxyl groups with the diazoquinone:

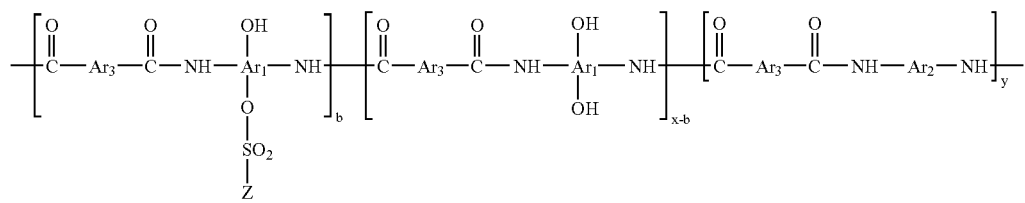

(F)

wherein $Ar_1$, $Ar_2$ and $Ar_3$ are as defined in the polybenzoxazole precursor polymer (G);

x represents 5 to 1000;

y represents 0 to 900;

b represents 0 to 50; and

Z represents a diazoquinone group.

(4) The photosensitive resin composition as described in any of (1) to (3) above, which further comprises at least one of a diazoquinone compound and a dihydropyridine compound.

(5) The photosensitive resin composition as described in any of (1) to (4) above, which further comprises a solvent, wherein the quinone diazide sulfonic acid ester of the phenol compound and the polybenzoxazole precursor are dissolved in the solvent (6) The photosensitive resin composition as described in (5) above, wherein the solvent is at least one selected from the group consisting of N-methylpyrrolidone, γ-butyrolactone, N,N-dimethylacetamide, dimethyl-2-piperidone and N,N-dimethylformamide.

(7) The photosensitive resin composition as described in any of (1) to (6), which further comprises an adhesion promoter.

(8) A method for manufacturing a semiconductor device comprising:
  applying a photosensitive resin composition as described in any of (1) to (7) above onto a semiconductor element, so as to form a coated semiconductor element;
  prebaking the coated semiconductor element;
  exposing the prebaked semiconductor element;
  developing the exposed semiconductor element; and
  heating the developed exposed semiconductor element.

DETAILED DESCRIPTION OF THE INVENTION

A photosensitive agent contained in the photosensitive resin composition of the invention is a quinone diazide sulfonic acid ester of a phenol compound represented by general formula (I):

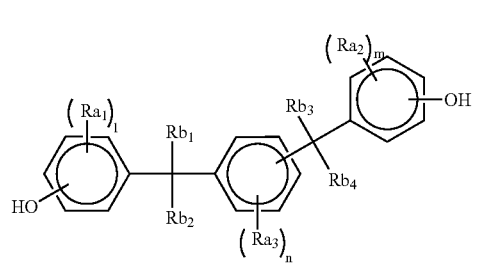

(I)

wherein $R_{a1}$ to $R_{a3}$ each independently represents an alkyl group, a cyclic alkyl group, an aryl group, an aralkyl group, an alkoxy group, a halogen atom, an acyl group, an acyloxy group, an alkoxycarbonyl group or an alkenyl group; $R_{b1}$ to $R_{b4}$ each independently represents an alkyl group; $R_{b1}$ and $R_{b2}$, or $R_{b3}$ and $R_{b4}$ may combine with each other to form a ring; and l, m and n each independently represents an integer of 0 to 3.

The alkyl group as $R_{a1}$ to $R_{a3}$ is preferably a straight-chain or branched alkyl group having 1 to 15 carbon atoms, and examples thereof include a methyl group, an ethyl group, a propyl group, an isopropyl group, an n-butyl group, an isobutyl group, a sec-butyl group, a pentyl group, a neopentyl group, a hexyl group and the like.

The cyclic alkyl group is preferably a cycloalkyl group having 3 to 30 carbon atoms, and examples thereof include a cyclopropyl group, a cyclopentyl group, a cyclohexyl group, an adamantyl group, a norbornyl group, a boronyl group and the like.

The aryl group is preferably an aryl group having 6 to 16 carbon atoms, and examples thereof include a phenyl group, a naphthyl group, a phenanthryl group and the like.

The aralkyl group is preferably an aralkyl group having 7 to 12 carbon atoms, examples thereof include a benzyl group, a phenethyl group, a naphthylmethyl group and the like.

The alkoxy group is preferably a straight-chain or branched alkoxy group having 1 to 30 carbon atoms, and examples thereof include a methoxy group, an ethoxy group, a propoxy group, an isopropoxy group, an n-butoxy group, an isobutoxy group, a sec-butoxy group, a t-butoxy group, a hexyloxy group and the like.

The halogen atoms include a fluorine atom, a chlorine atom, a bromine atom and an iodine atom.

The acyl group is preferably an acyl group having 1 to 30 carbon atoms, and examples thereof include an acetyl group, a propionyl group, a pivaloyl group, a butyryl group, a valeryl group and the like.

The acyloxy group is preferably an acyloxy group having 1 to 30 carbon atoms, examples thereof include an acetoxy group, a methylbutynoyloxy group, a methyldecynoyloxy group, a propionyloxy group, a butyryloxy group, a valeryloxy group, a palmitoyloxy group, a benzoyloxy group and the like.

The alkoxycarbonyl group is preferably an alkoxycarbonyl group having 1 to 30 carbon atoms, and examples thereof include a methoxycarbonyl group, an ethoxycarbonyl group, a butoxycarbonyl group, an octyloxycarbonyl group and the like.

The alkenyl group is preferably an alkenyl group having 2 to 8 carbon atoms, and examples thereof include a vinyl group, an allyl group, a butenyl group, a hexenyl group and the like.

The alkyl groups as $R_{b1}$ to $R_{b4}$ include the same as the alkyl groups as $R_{a1}$ to $R_{a3}$, and have preferably 1 to 10 carbon atoms and more preferably 1 to 5 carbon atoms.

$R_{b1}$ and $R_{b2}$, or $R_{b3}$ and $R_{b4}$ may combine with each other to form a ring. Specific examples of the rings include, for example, 3- to 6-membered rings such as a cyclohexane ring.

Each group described above may further have a substituent group. The further substituent groups include an alkoxy group, a cycloalkyl group, an acyl group, an acyloxy group, a halogen atom, a hydroxyl group, a carboxyl group and the like.

Specific examples of the phenol compounds represented by general formula (I) are shown below, but are not limited thereto.

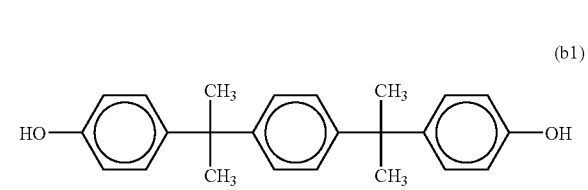

(b1)

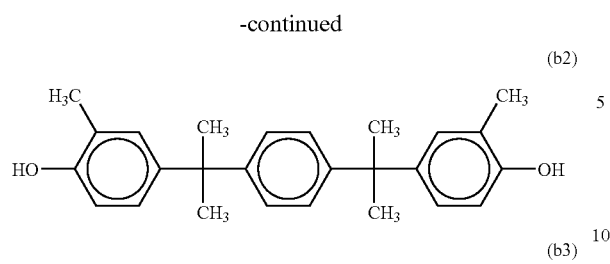
(b2)
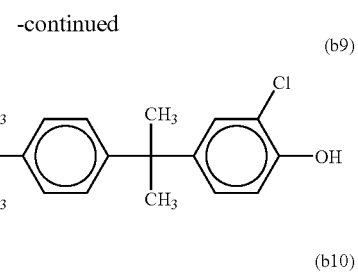
(b9)
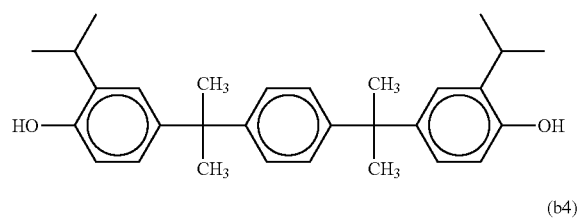
(b3)
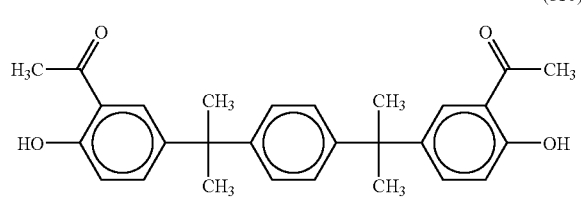
(b10)
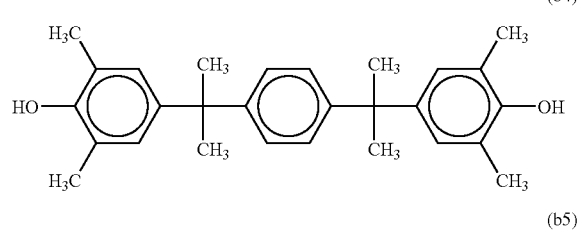
(b4)
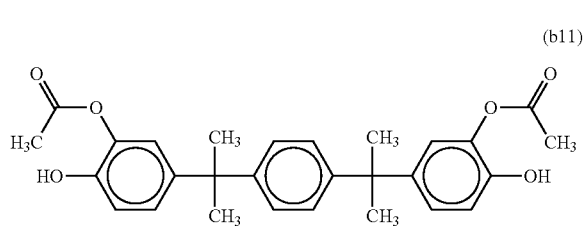
(b11)
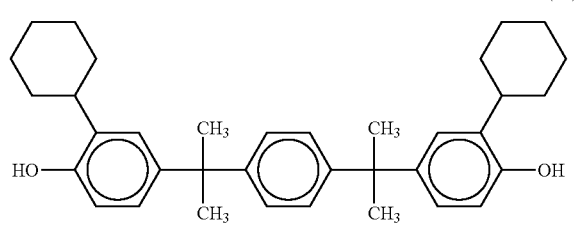
(b5)
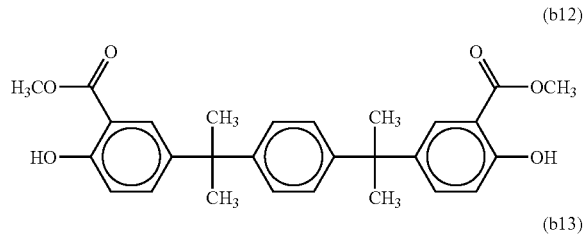
(b12)
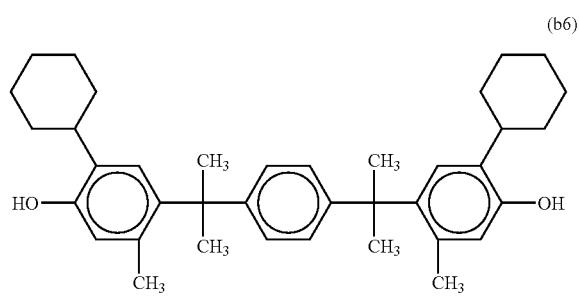
(b6)
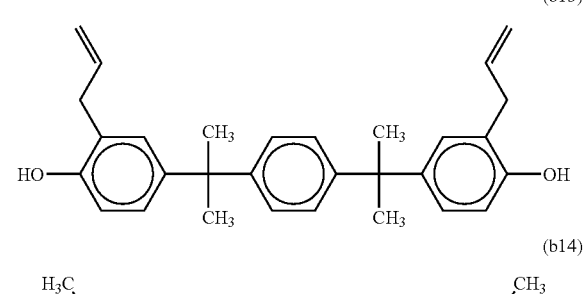
(b13)
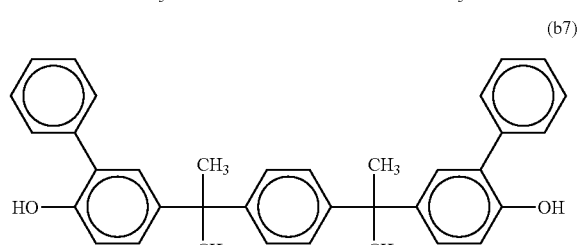
(b7)
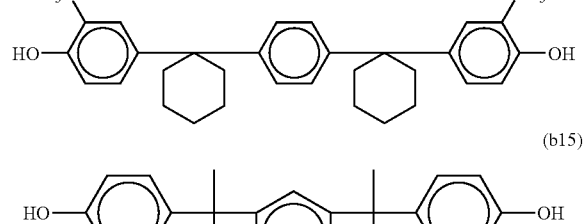
(b14)
(b8)
(b15)
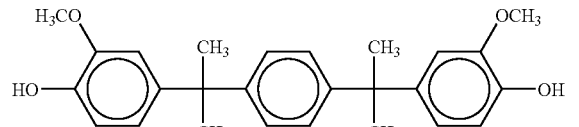
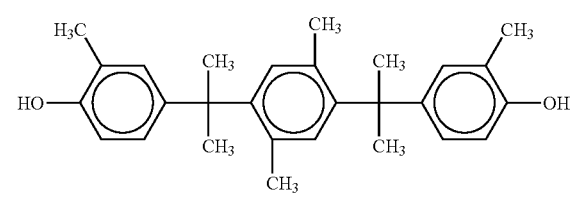
(b16)

-continued

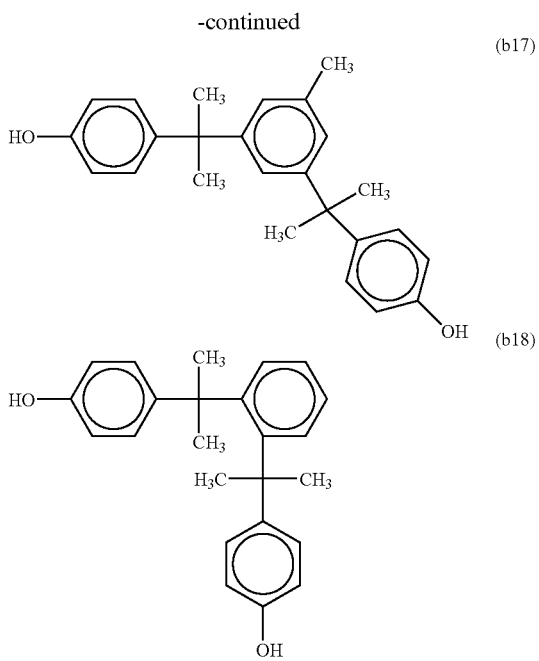

Esterification for converting the phenol compound represented by general formula (I) to the quinone diazide sulfonic acid ester can be performed by a known method.

For example, the phenol compound represented by general formula (I) and 1,2-naphthoquinonediazide-5-(and/or -4-) sulfonyl chloride are subjected to an esterification reaction in the presence of a basic catalyst, there by obtaining the ester.

That is to say, a flask is charged with specific amounts of the phenol compound represented by general formula (I), 1,2-naphthoquinonediazide-5-(and/or -4-) sulfonyl chloride and a solvent such as dioxane, acetone, tetrahydrofuran, methyl ethyl ketone, N-methylpyrrolidone, chloroform, trichloro-ethane, trichloroethylene, dichloroethane or γ-butyllactone, and the basic catalyst, for example, sodium hydroxide, sodium carbonate, sodium hydrogen carbonate, triethylamine, 4-dimethylaminopyridine, 4-methylmorpholine, N-methyl-piperazine or N-methylpiperidine, is added dropwise to perform condensation. The reaction temperature is usually from −20 to 60° C., and preferably from 0 to 40° C.

The resulting product is crystallized in water, and then, washed with water, followed by further purification and drying.

The amount of the photosensitive agent added is generally from 1 to 50% by mass, and preferably from 5 to 40% by mass, based on the total solid content (the total amount of components constituting a cured product finally obtained, excluding the solvent) of the photosensitive resin composition of the invention. (In this specification, mass ratio is equal to weight ratio.)

(Polybenzoxazole Precursor)

As a polybenzoxazole precursor contained in the photosensitive resin composition of the invention, there can be used known one described in U.S. Pat. No. 4,371,685, JP-T-2002-526795 or the like. Examples thereof include a polybenzoxazole precursor polymer (G) having the following structure:

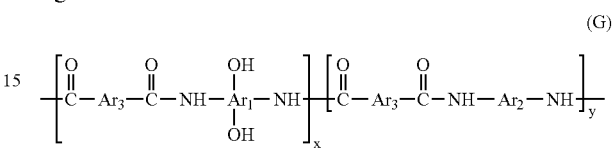

wherein $Ar_1$ is a tetravalent aromatic group, aliphatic group, or heterocyclic group or a mixed group thereof; $Ar_2$, which may contain silicon in some cases or not, is a bivalent aromatic group, heterocyclic group, alicyclic group or aliphatic group; $Ar_3$ is a bivalent aromatic group, aliphatic group or heterocyclic group or a mixed group thereof; x represents 5 to 1000; and y represents 0 to 900.

The polybenzoxazole precursor generally has a polymerization degree of 10 to 1000, and synthesized by reacting the following monomers (A), (B) and (C) in the presence of a base.

wherein $Ar_1$, $Ar_2$, $Ar_3$, x and y are as already defined above, and W is Cl, OR or OH, wherein R is alkyl or cycloalkyl, for example, $-CH_3$, $-C_2H_5$, n-$C_3H_7$, i-$C_3H_7$, n-$C_4H_9$, t-$C_4H_9$ or cyclohexyl.

The ratio of [(A)+(B)]/(C) is generally between about 0.9 and 1.1. The amount of the monomer (A) is from about 10 to 100 mol % of [(A)+(B)], and the amount of the monomer (B) is from about 0 to 90 mol % of [(A)+(B)].

In addition, there may be used a polybenzoxazole precursor (F) obtained by reacting the above-mentioned polybenzoxazole precursor (G) with a diazoquinone to partially cap hydroxyl groups with the diazoquinone.

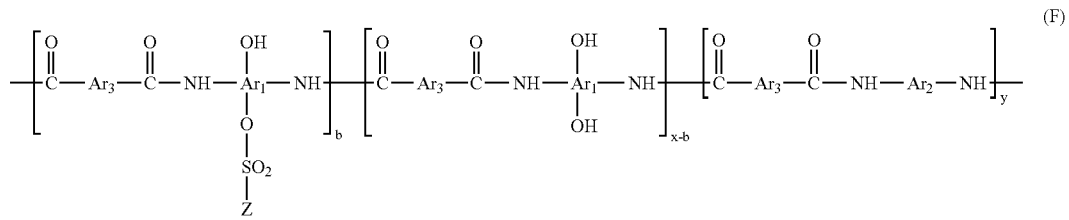

wherein Ar$_1$, Ar$_2$ and Ar$_3$ are as defined above; x represents 5 to 1000; y represents 0 to 900; b represents 0 to 50; and Z represents a diazoquinone group, and includes the following groups:

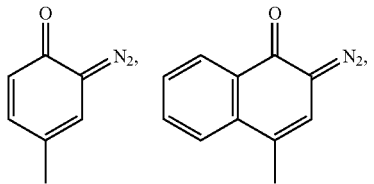

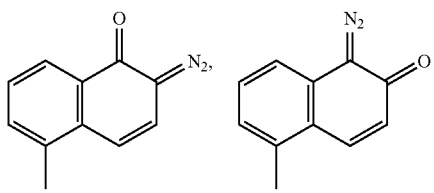
and

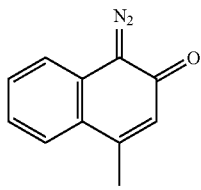

For example, the polymer (G) can be reacted with about 1 to 35 mol % of the diazoquinone to obtain the polybenzoxazole precursor (F) in which x is from 10 to 1000, y is from 0 to 900, and b is from 0.10 to 350.

In the monomer (A) which is a constituent of the polymer (G) and the polymer (F), Ar$_1$ is a tetravalent aromatic group, aliphatic group or heterocyclic group, and examples thereof include the following groups:

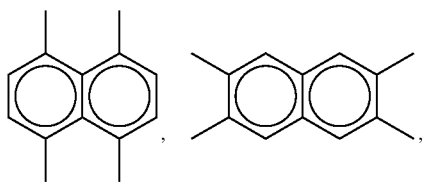

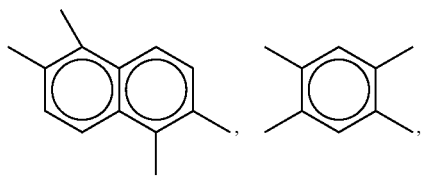

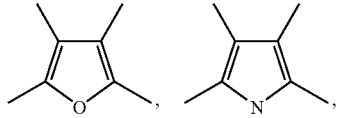

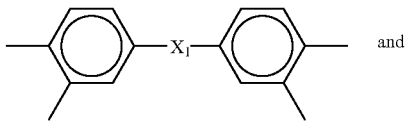
and

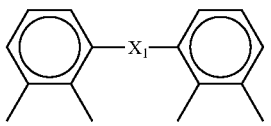

wherein X$_1$ represents —O—, —S—, —C(CF$_3$)$_2$—, —CH$_2$—, —SO$_2$—, —NHCO— or the following group:

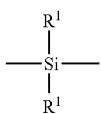

wherein R$^1$ is alkyl or cycloalkyl such as —CH$_3$, —C$_2$H$_5$, n-C$_3$H$_7$, i-C$_3$H$_7$, n-C$_4$H$_9$, t-C$_4$H$_9$ or cyclohexyl.

Ar$_1$ is not limited to these groups. Further, the monomer (A) may be a mixture of two or more monomers.

In the monomer (B) which is a constituent of the precursor (G) and the capped precursor (F), Ar$_2$ is a bivalent aromatic group, heterocyclic group, alicyclic group or aliphatic group which may contain silicon or not.

However, it should be understood that the monomers (B) are not limited thereto. The Ar$_2$-containing monomers (B) include but are not limited to, for example, 5(6)-diamino-1-(4-ainophenyl)-1,3,3-trimethylindane (DAPI), m-phenylenediamine, p-phenylenediamine, 2,2'-bis(tri-fluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenylsulfone, 3,4'-diaminodiphenylsulfone, 4,4'-diaminodiphenylsulfone, 3,3'-diaminodiphenylmethane, 4,4'-diaminodiphenylmethane, 3,4'-diaminodiphenylmethane, 4,4'-diaminodiphenylketone, 3,3'-diaminodiphenylketone, 3,4'-diaminodiphenylketone, 1,3-bis(4-aminophenoxy)benzene, 1,3-bis(3-aminophenoxy)benzene, 1,4-bis (γ-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminododecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethane, 4,4'-diaminodiphenylethane, 4,4'-diaminodiphenyl sulfide, 2,6- diaminopyridine, 2,5-diaminopyridine, 2,6-diamino-4-trifluoromethylpyridine, 2,5-diamino-1,3,4-oxadiazole, 1,4-diaminocyclohexane, piperazine, 4,4'-methylenedianiline, 4,4'-methylenedibis(o-chloroaniline), 4,4'-methylenebis(3-methylaniline), 4,4'-methylenebis (2-ethylaniline), 4,4'-methylenebis (2-methoxyaniline), 4,4'-oxydianiline, 4,4'-oxybis(2-methoxyaniline), 4,4'-oxybis(2-chloroaniline), 4,4'-thiodianiline, 4,4'-thiobis(2-methylaniline), 4,4-thiobis(2-methoxyaniline), 4,4'-thiobis(2-chloroaniline), 3,3'-sulfonyldianiline and mixtures thereof.

In the monomer (C) which is a constituent of the precursor (G) and the capped precursor (F), Ar$_3$ is a bivalent aromatic group, aliphatic group or heterocyclic group, and examples thereof include the following groups:

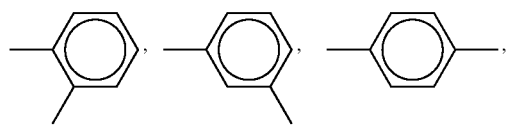

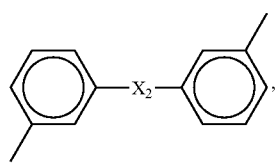

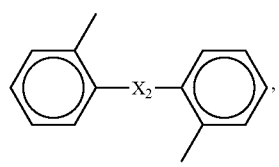

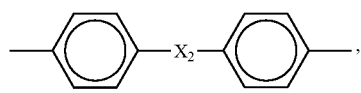

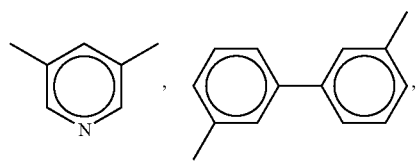

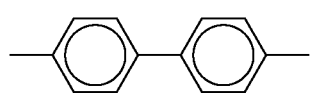

wherein X$_2$ is —O—, —S—, —C(CF$_3$)$_2$—, —CH$_2$—, —SO$_2$— or —NHCO—.

Ar$_3$ is not limited to these groups. Further, the monomer (C) may be a mixture of two or more monomers.

The diazoquinone compounds which are reacted with the PBO precursor (G) include, for example, the following, a plurality of which may be used.

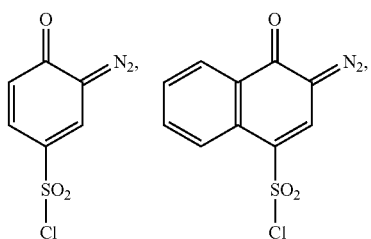

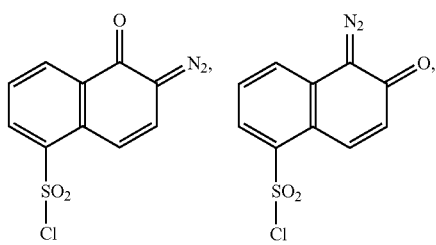

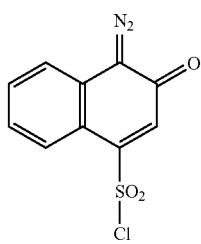

The preferred reaction solvents are N-methyl-2-pyrrolidone (NMP), γ-butyrolactone (GBL), N,N-dimethylformamide (DMF), N,N-dimethylacetamide (DMAC), dimethyl-2-piperidone, dimethyl sulfoxide (DMSO), sulfolane and diglyme, and most preferred are N-methyl-2-pyrrolidone (NMP) and γ-butyrolactone (GBL). In order to react a dicarboxylic acid, or a chloride or an ester thereof with at least one aromatic and/or heterocyclic dihydroxydiamine, and with at least one diamine in some cases, any reaction commonly used may be employed. Examples of the suitable carboxylic acids are selected from the group consisting of 4,4'-diphenyl ether dicarboxylic acid, terephthalic acid, isophthalic acid and mixtures thereof. Examples of the suitable dihydroxydiamine compounds are 3,3'-dihydroxy-4,4'-diaminodiphenyl ether, 3,3'-dihydroxybenzidine, hexafluoro-2,2-bis-3-amino-4-hydroxyphenylpropane and mixtures thereof. The reaction is generally conducted at about −10 to about 30° C. for about 6 to 48 hours. The molar ratio of dicarboxylic acid and (diamine+dihydroxydiamine) is about 0.9-1.1:1.

The capped PBO precursor can be manufactured according to the following reaction:

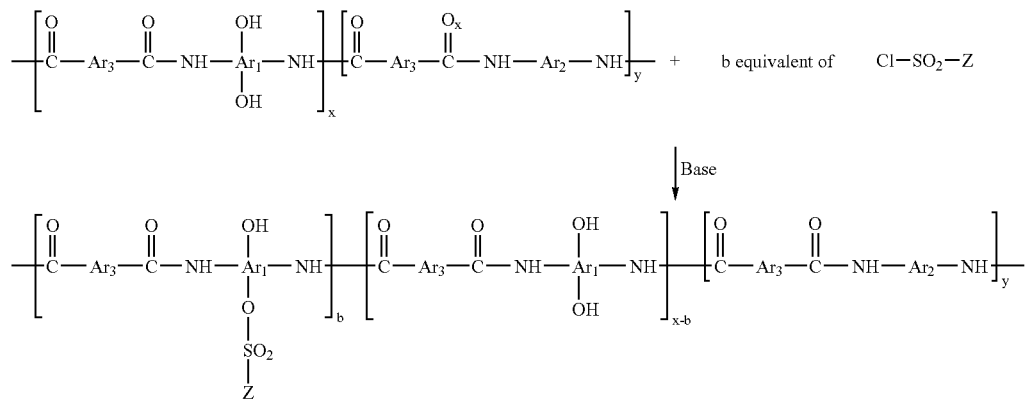

wherein Z is as already defined.

In order to react polybenzoxazole with a photoactive moiety, Cl—SO$_2$-Z, any suitable method may be used. In general, the reaction is conducted at about 0 to about 30° C. for about 3 to about 24 hours in the presence of a base such as pyridine, a trialkylamine, methylpyridine, lutidine or n-methyl-morpholine. The most preferred base is triethylamine.

The b/x ratio is generally from 0.01 to 0.35, preferably from 0.02 to 0.20, and most preferably from 0.03 to 0.05.

The amount of the polybenzoxazole precursor added is generally from 50 to 99% by mass, and preferably from 60 to 95% by mass, based on the total solid content (the total amount of components constituting a cured product finally obtained, excluding the solvent) of the photosensitive resin composition of the invention.

(Combined Photosensitive Agent)

Another photosensitive agent, for example, another diazoquinone compound (H) or dihydropyridine compound (I), may be used in combination with the quinone diazide sulfonic acid ester of the phenol compound represented by the above-mentioned general formula (I) as the photosensitive agent.

Such a photosensitive agent which may be used in combination is added generally in an amount of 99% by mass or less, and preferably in an amount of 80% by mass, based on the quinone diazide sulfonic acid ester of the phenol compound represented by the above-mentioned general formula (I).

The diazoquinone compounds which may be used in combination include, for example, compounds having the following structures:

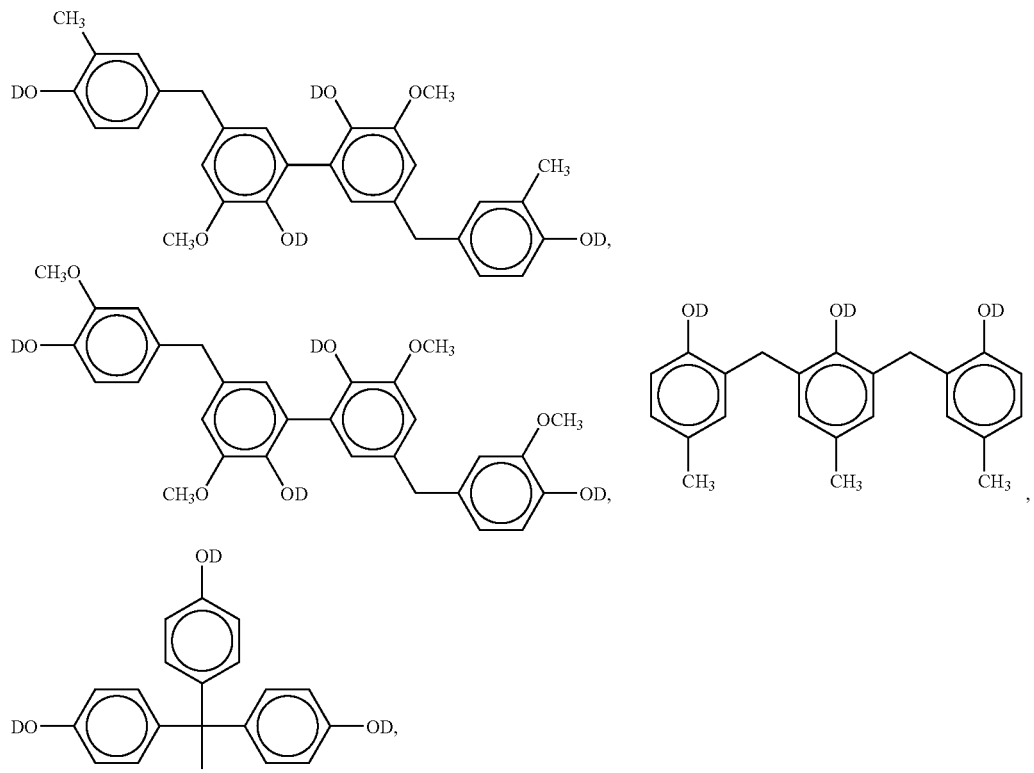

-continued
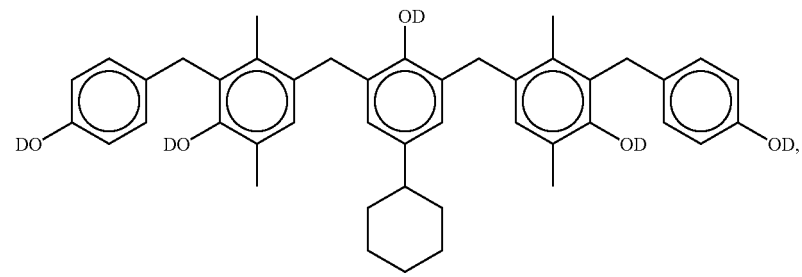
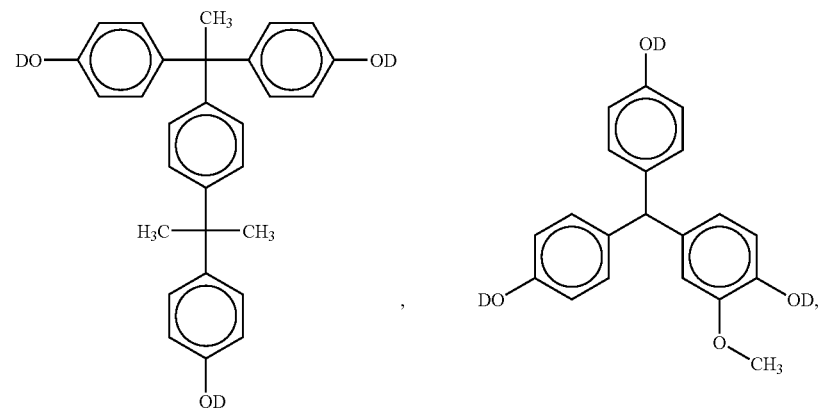
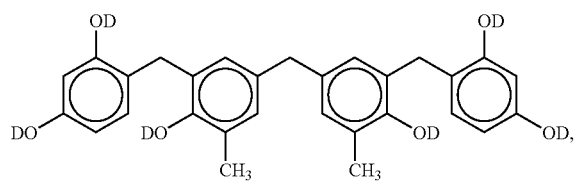
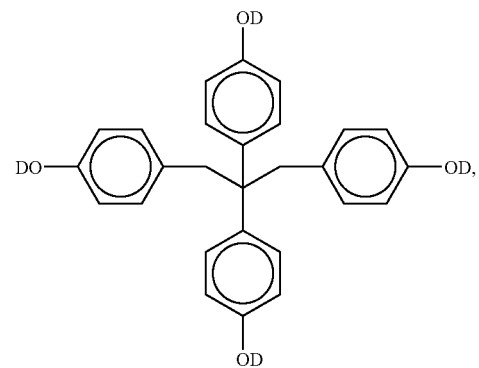
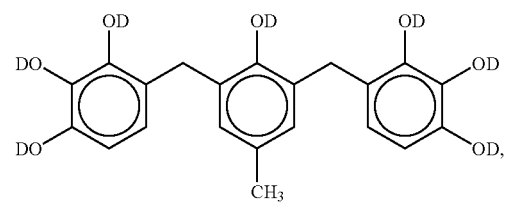
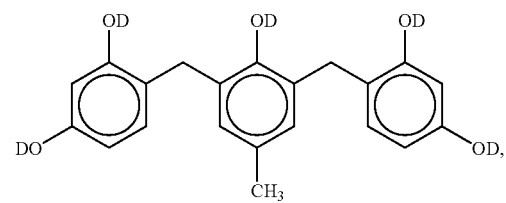

-continued
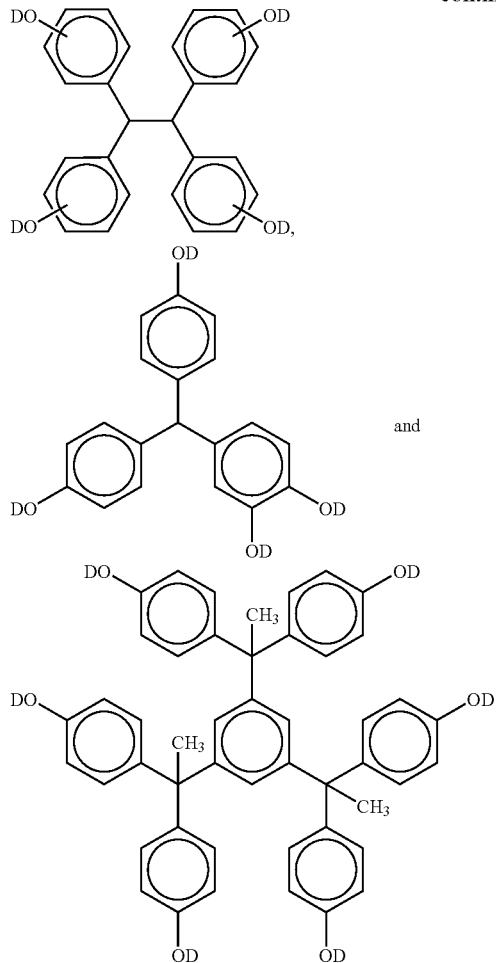
wherein D is independently H or any one of the following groups:
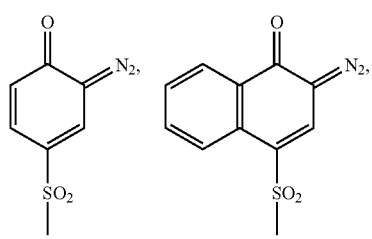
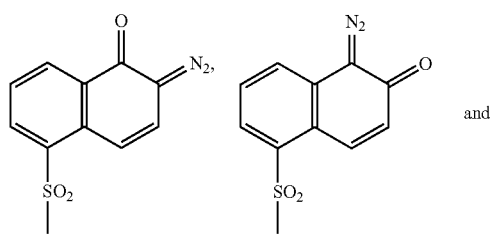
and
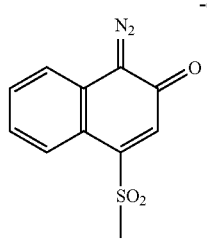
However, in each composition, at least one D may not be H, but is not limited thereto.
The dihydropyridines (I) include, for example, a compound having the following structure:
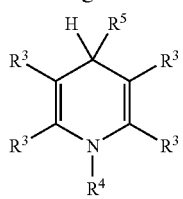
wherein $R^3$ groups are the same or different, and has H, OH, COO—$(CH_2)_n$—$CH_3$, $(CH_2)_n$—$CH_3$, O—$(CH_2)_n$—$CH_3$, CO—(CH$_2$)$_n$—CH$_3$, (CF$_2$)$_n$—CF$_3$, C$_6$H$_5$, COOH, (CH$_2$)$_n$—O—(CH$_2$)$_m$—CH$_3$, (CH$_2$)$_n$—OH, CH$_2$=CH—(CH$_2$)$_p$—CO—CH$_2$, F, Cl, Br or I, wherein m is from 0 to 10, n is from 0 to 10, and p is from 0 to 4; R$^4$ is H, C1-C7 alkyl, cycloalkyl, phenyl or monosubstituted phenyl; and R$^5$ is any one of the following:

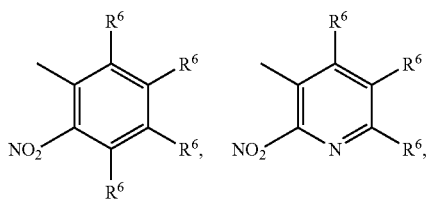

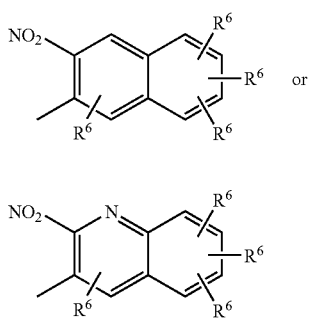

wherein R$^6$ is defined similarly to R$^3$, and the NO$_2$ group is at the ortho position with respect to the dihydropyridine ring.

For example, the dihydropyridines include the following:

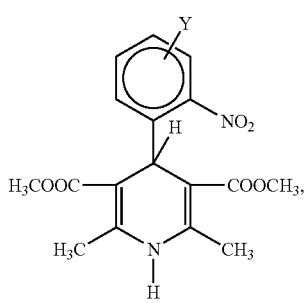

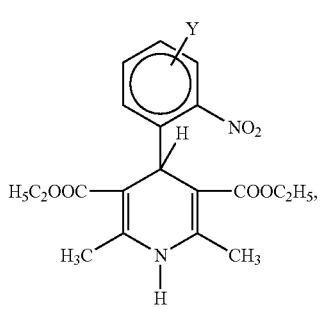

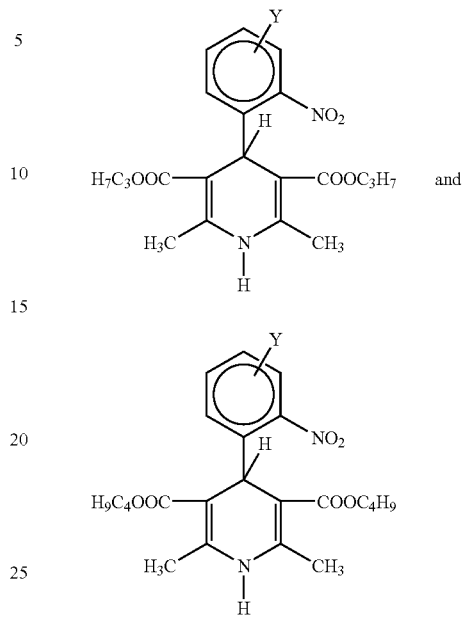

wherein Y is —OR$^2$, wherein R$^2$ is a substituted or unsubstituted univalent aromatic or aliphatic group, CN, Cl, Br or I.

(Solvent)

The photosensitive resin composition of the invention is preferably used as a solution in which at least the photosensitive agent and the PBO precursor are dissolved in a solvent.

The suitable solvents include but are not limited to organic solvents such as N-methylpyrrolidone (NMP), γ-butyrolactone (GBL), N,N-dimethylacetamide (DMAc), dimethyl-2-piperidone, N,N-dimethylformamide (DMF) and mixtures thereof. The preferred solvents are γ-butyrolactone and N-methylpyrrolidone. Most preferred is γ-butyrolactone.

(Adhesion Promoter)

The photosensitive resin composition of the invention may contain an adhesion promoter. The suitable adhesion promoters include, for example, a dianhydride/DAPI/bis(3-aminopropyl)tetramethylsiloxane (BATS) polyamic acid copolymer, an amino silane and mixtures thereof. The addition of the dianhydride/DAPI/BATS polyamic acid copolymer enhances the adhesion characteristics of the resin composition.

The dianhydride/DAPI/BATS polyamic acid copolymer can be synthesized in a reaction solvent by the reaction of a tetracarboxylic dianhydride (J), BATS diamine and DAPI diamine according to the following reaction:

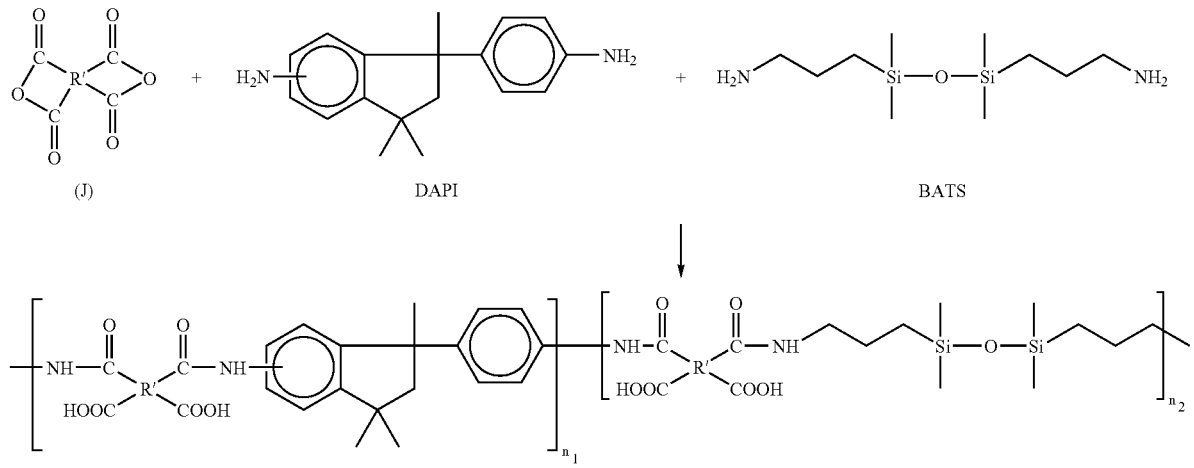

wherein R' is a tetravalent group.

The tetracarboxylic dianhydride (J) may be, but is not limited to pyramellitic dianhydride (PMDA), 3,3',4,4'-benzophenoetetracarboxylic dianhydride, 3,3',4,4'-bi-phenyltetracarboxylic dianhydride, 3,3',4,4'-diphenyl-sulfonetetracarboxylic dianhydride, 4,4'-perfluoriso-propylidinediphthalic dianhydride, 4,4'-oxydiphthalic anhydride, bis(3,4-dicarboxyl)tetramethyldisiloxane dianhydride, bis(3,4-dicarboxylphenyl)dimethylsilane dianhydride, butanetetracarboxylic dianhydride, 1,4,5,8-naphthalenetetracarboxylic dianhydride and mixtures thereof.

The molar ratio of DAPI/BATS is about 0.1/99.9 to 99.9/0.1. The preferred molar ratio is about 10/90 to 40/60 and the most preferred molar ratio is about 15/85 to 30/70.

The preferred reaction solvents are N-methyl-2-pyrrolidone (NMP), γ-butyrolactone (GBL), N,N-dimethylformamide (DMF), N,N-dimethylacetamide (DMAC), dimethylsulfoxide (DMSO), sulfolane and diglyme. The most preferred reaction solvents are N-methyl-2-pyrrolidone (NMP) and γ-butyrolactone (GBL).

In order to react the dianhydride with the above-mentioned two diamines, any suitable reaction may be used. In general, the reaction is conducted at about 10 to about 50° C. for about 6 to 48 hours. The molar ratio of the dianhydride and the diamine should be about 0.9-1.1:1.

The photosensitive compositions of the invention may further include other additives such as a leveling agent.

As for a method for forming a relief pattern using the photosensitive resin composition of the invention, the cured relief pattern can be formed by (a) coating a suitable substrate with the photosensitive composition containing the PBO precursor, the photosensitive agent and the solvent, (b) baking the coated substrate, (c) exposing the baked substrate to active light or radiation, (d) developing the exposed substrate with an aqueous developer, and (e) curing the developed substrate.

The coated exposed substrate can also be baked at high temperature prior to development. Further, the developed substrate may be rinsed prior to curing.

As described above, the semiconductor device can be manufactured by applying the photosensitive resin composition of the invention onto the semiconductor element so as to give a specific thickness (for example, 0.1 to 30 µm) after heat curing, followed by prebaking, exposure, development and heat curing.

The method for forming the relief pattern will be described in more detail below.

The suitable substrate is coated with the photosensitive resin composition of the invention. The substrate may be, for example, a semiconductor material such as a silicon wafer, a ceramic substrate, glass, metal or plastic. Coating methods include but are not limited to spray coating, spin coating, offset printing, roller coating, screen printing, extrusion coating, meniscus coating, curtain coating and immersion coating.

The coating film is previously baked at an elevated temperature of about 70 to 120° C. for several minutes to half an hour depending on the method, in order to evaporate the remaining solvent. Subsequently, the resulting dry film is exposed to active light or radiation in a preferred pattern through a mask. An X-ray, an electron beam, ultraviolet light, visible light and the like can be used. The most preferred radiation is one having a wavelength of 436 nm (g-line) or 365 nm (i-line).

Following the exposure to the active light or the radiation, it is advantageous to heat the coated exposed substrate to a temperature of about 70 to 120° C. The coated exposed substrate is heated in this temperature range for a short period of time, typically several seconds to several minutes. This step of this method is commonly technically called post exposure baking.

Then, the coating film is developed with an aqueous developer and the relief pattern is formed. The aqueous developers include alkali solutions such as solutions of inorganic alkalis (for example, potassium hydroxide, sodium hydroxide and aqueous ammonia), primary amines (for example, ethylamine and n-propylamine), secondary amines (for example, diethylamine and di-n-propylamine), tertiary amines (for example, triethylamine), alcoholamines (for example, triethanolamine), quaternary ammonium salts (for example, tetramethylammonium hydroxide and tetraethylammonium hydroxide) and mixtures thereof. The most preferred developers are those containing tetramethylammonium hydroxide. In addition, an appropriate amount of a surfactant may be added to the developer. Development can be carried out by means of immersion, spray, puddling or another similar developing method.

In some cases, the relief pattern is then rinsed using deionized water. Then, in order to obtain the final pattern of high heat resistant polymer, the relief pattern is cured, thereby forming an oxazole ring. Curing is performed by baking the substrate at the glass transition temperature Tg of the polymer so as to obtain the oxazole ring that forms a final pattern of high heat resistance. In general, a temperature exceeding about 200° C. is used. It is preferred to use a temperature of about 250 to 400° C.

EXAMPLES

The present invention will be illustrated in greater detail with reference to the following examples, but the invention should not be construed as being limited thereto.

[Synthesis of Photosensitive Agent]

(1) Synthesis Example of Quinone Diazide Sulfonic Acid Ester: Synthesis of Quinone Diazide Sulfonic Acid Ester (B1) of Phenol Compound (b1)

To a three-necked flask, 17.3 g of phenol compound (b1) and 200 ml of 1,4-dioxane were added, and the phenol compound was dissolved until uniformity was achieved. Then, 13.4 g of 1,2-naphthoquinonediazide-4-sulfonyl chloride was added and dissolved therein. The reaction vessel was cooled with ice water to 10° C., and then, 5.6 g of triethylamine was added dropwise taking 1 hour. After the termination of dropwise addition, stirring was performed for 4 hours. After the reaction was finished, distilled water was added to dissolve a precipitated salt, followed by stirring for 30 minutes. After neutralization with diluted hydrochloric acid, crystallization was performed in 1 liter of distilled water. A dark yellow powder precipitated was taken by filtration. The filtrate was dissolved again in 200 ml of dioxane, and crystallized in 1 liter of distilled water. The precipitated filtrate was filtered, and the filtrate was washed with 1 liter of distilled water and filtered to collect 33.2 g of desired product (B1) as a dark yellow powder. The resulting (B1) was analyzed by high speed liquid chromatography (S1525 manufactured by Waters). As a result, the purity of the esterified product of phenol compound (b1) was 98% (detection wavelength: 254 nm).

Photosensitive agent (B2) and the following compounds used in examples are compounds synthesized from the corresponding phenol compound (b2) and the following phenol compounds by a method similar to the above-mentioned method.

[Synthesis of PBO Precursor Resins]

(2) Synthesis of Resin A-1

To a 100-ml three-necked flask, 3.85 g (10.5 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids were dissolved, and then cooled in an ice bath at 0 to 5° C. To this solution, 1.02 g (5 mmol) of isophthaloyl chloride and 1.48 g (5 mmol) of 1,4-oxydibenzoyl chloride dissolved in 10 g of NMP was added dropwise. After the addition was completed, the resulting mixture was stirred at room temperature for 18 hours. The viscous solution was poured in 800 ml of deionized water vigorously stirred, and a precipitated white powder was collected by filtration and washed with deionized water and a water/methanol (50/50) mixture. The polymer was dried under vacuum at 40° C. for 24 hours to obtain resin A-1 as a desired product. The yield was almost quantitative, and the intrinsic viscosity of resin A-1 was 0.28 dl/g, when measured in NMP at a concentration of 0.5 g/dl at 25° C.

(3) Synthesis of Resin A-2

To a 100-ml three-necked flask, 3.85 g (10.5 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids were dissolved, and then cooled in an ice bath at 0 to 5° C. To this solution, 0.41 g (2 mmol) of isophthaloyl chloride and 2.36 g (8 mmol) of 1,4-oxydibenzoyl chloride dissolved in 10 g of NMP was added dropwise. After the addition was completed, the resulting mixture was stirred at room temperature for 18 hours. The viscous solution was poured in 800 ml of deionized water vigorously stirred, and a precipitated white powder was collected by filtration and washed with deionized water and a water/methanol (50/50) mixture. The polymer was dried under vacuum at 40° C. for 24 hours to obtain resin A-2 as a desired product. The yield was almost quantitative, and the intrinsic viscosity of resin A-2 was 0.26 dl/g, when measured in NMP at a concentration of 0.5 g/dl at 25° C.

(4) Synthesis of Resin A-3

There were added 5.42 g (10.0 mmol) of resin A-1 obtained above and 50 ml of tetrahydrofuran (THF). The mixture was stirred for 10 minutes, and solid matter was completely dissolved. Then, 0.16 g (2 mmol) of acetyl chloride was added, and the resulting mixture was further stirred for 10 minutes. Then, 0.16 g (2 mmol) of pyridine was gradually added for 30 minutes, and then, the resulting mixture was stirred for 5 hours. Subsequently, the reaction mixture was gradually added to 500 ml of deionized water vigorously stirred. The precipitated product was separated by filtration, and washed with 200 ml of deionized water. To this product, 600 ml of deionized water was further added, and the resulting mixture was vigorously stirred for 30 minutes. After filtration, the product was washed with 100 ml of deionized water. The isolated product was dried at 40° C. overnight. The yield was 92%.

(5) Synthesis of Resin A-4

There were added 5.42 g (10.0 mmol) of resin A-1 obtained above and 50 ml of tetrahydrofuran (THF). The mixture was stirred for 10 minutes, and solid matter was completely dissolved. Then, 0.54 g (2 mmol) of 1,2-naphthoquinonediazide-5-sulfonyl chloride was added, and the resulting mixture was further stirred for 10 minutes. Then, 0.20 g (2 mmol) of triethylamine was gradually added for 30 minutes, and then, the resulting mixture was stirred for 5 hours. Subsequently, the reaction mixture was gradually added to 500 ml of deionized water vigorously stirred. The precipitated product was separated by filtration, and washed with 200 ml of deionized water. To this product, 600 ml of deionized water was further added, and the resulting mixture was vigorously stirred for 30 minutes. After filtration, the product was washed with 100 ml of deionized water. The isolated product was dried at 40° C. overnight. The yield was 90%.

(6) Synthesis of Resin A-5

Using the above-mentioned resin A-2 as a raw material, resin A-5 was synthesized by the same technique as with resin A-3.

(7) Preparation of Photosensitive Resin Compositions

Each of the photosensitive agents and resins described in Table 1 and 2% by mass (based on the resin) of the following adhesion promoter C (alkoxysilane compound) were dissolved in γ-butyrolactone to prepare 100 g of a solution having a solid concentration of 30% by mass, followed by filtration through a cassette type filter (0.2 μm) made of polytetrafluoroethylene, thus preparing photosensitive resin compositions.

Adhesion Promoter C

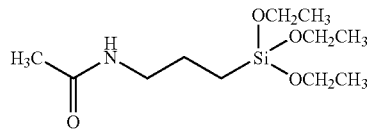

In addition, photosensitive agents BR1 to BR4 for comparison are compounds obtained by esterifying the following parent phenol compounds with quinone diazide sulfonic acid by the same method as in the above synthesis example (1).

Parent Phenol Compound of Photosensitive Agent BR1 for Comparison

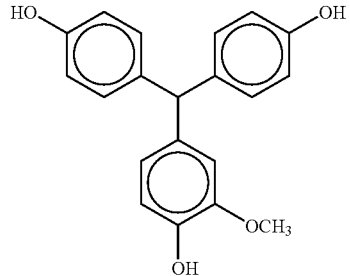

Parent Phenol Compound of Photosensitive Agent BR2 for Comparison

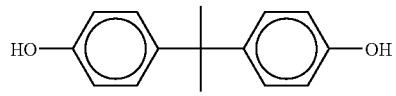

Parent Phenol Compound of Photosensitive Agent BR3 for Comparison

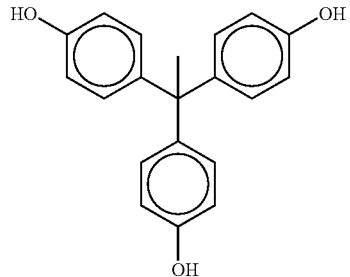

Parent Phenol Compound of Photosensitive Agent BR4 for Comparison

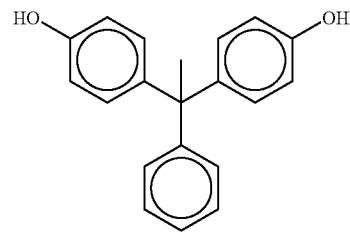

(8) Evaluation of Rate of Residual Film

The composition prepared was spin coated onto a silicon wafer, and baked on a hotplate at 120° C. for 3 minutes to obtain a film having a thickness of 7 μm. This film was exposed using an i-line stepper and a mask of an 8-μm via hole repeat pattern, then developed using a 0.262 N aqueous TMAH solution, and subsequently rinsed with deionized water.

The exposure reproducing the 8-μm via hole pattern was taken as the optimum exposure, and exposure was performed at that exposure. Then, development was carried out, and the film thickness (FT1) of an unexposed area at the time when the pattern was obtained was measured. The rate of residual film was defined as below:

Rate of Residual Film=100×$FT1$ (μm)/7 μm (9) Coloration after Curing

The above-mentioned composition was applied onto a quartz substrate, and heated at 350° C. for 1 hour in a curing oven under a nitrogen atmosphere. The case where the transmittance of this substrate in the visible light region was 70% or more was taken as "good", and the case of less than 70% was taken as "poor".

TABLE 1

| | Photosensitive Agent | Resin | Rate of Residual Film (%) | Coloration after Curing |
|---|---|---|---|---|
| Example 1 | B1 9.7 g | A-3 19.7 g | 80 | Good |
| Example 2 | B2 9.7 g | A-3 19.7 g | 85 | Good |
| Example 3 | B2 5.9 g | A-4 23.5 g | 86 | Good |
| Example 4 | B2 9.7 g | A-5 19.7 g | 90 | Good |
| Example 5 | B5 5.9 g | A-4 23.5 g | 88 | Good |
| Example 6 | B9 9.7 g | A-5 19.7 g | 91 | Good |
| Example 7 | B11 9.7 g | A-3 19.7 g | 85 | Good |
| Example 8 | B13 9.7 g | A-3 19.7 g | 89 | Good |
| Comparative Example 1 | BR1 9.7 g | A-3 19.7 g | 45 | Poor |
| Comparative Example 2 | BR2 9.7 g | A-3 19.7 g | 40 | Good |
| Comparative Example 3 | BR3 9.7 g | A-3 19.7 g | 40 | Good |
| Comparative Example 4 | BR4 9.7 g | A-3 19.7 g | 50 | Good |

The results of Table 1 show that the compositions of the invention are excellent because they are significantly improved in the rate of residual film and have no problem of coloration.

According to the photosensitive resin composition of the invention, it is possible to manufacture a relief structure based on a PBO resin and excellent in heat resistance, mechanical characteristics, electric characteristics and chemical resistance, while reducing film loss at the time of development and the problem of coloration at the time on heat curing. The composition can be suitably used for semiconductor applications, particularly as a buffer coat.

The entire disclosure of each and every foreign patent application from which the benefit of foreign priority has been claimed in the present application is incorporated herein by reference, as if fully set forth.

What is claimed is:

1. A photosensitive resin composition comprising:
a quinone diazide sulfonic acid ester of a phenol compound represented by formula (I); and
a polybenzoxazole precursor:

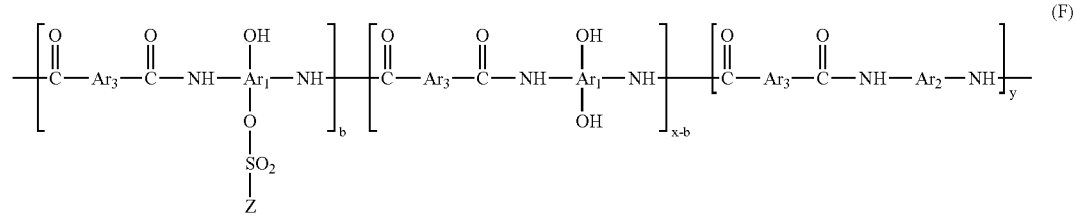

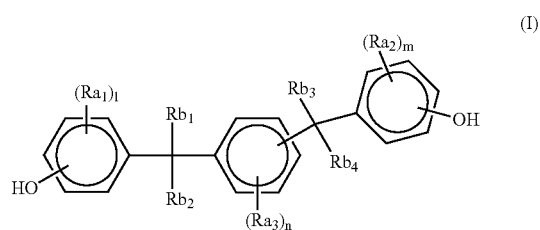

wherein $R_{a1}$ to $R_{a3}$ each independently represents an alkyl group, a cyclic alkyl group, an aryl group, an aralkyl group, an alkoxy group, a halogen atom, an acyl group, an acyloxy group, an alkoxycarbonyl group or an alkenyl group;

$R_{b1}$ to $R_{b4}$ each independently represents an alkyl group, and $R_{b1}$ and $R_{b2}$, or $R_{b3}$ and $R_{b4}$ may combine with each other to form a ring; and l, m and n each independently represents an integer of from 0 to 3.

2. The photosensitive resin composition according to claim 1,
wherein the polybenzoxazole precursor is a polybenzoxazole precursor polymer (G) having a following structure:

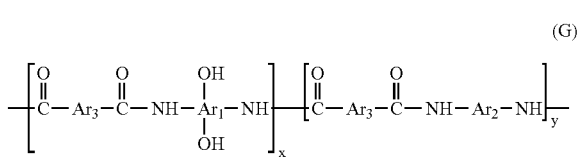

wherein $Ar_1$ is a tetravalent aromatic group, an aliphatic group or a heterocyclic group or a mixed group thereof;

$Ar_2$, which may contain silicon or not, is a bivalent aromatic group, a heterocyclic group, an alicyclic group or an aliphatic group;

$Ar_3$ is a bivalent aromatic group, an aliphatic group or a heterocyclic group or a mixed group thereof;

x represents 5 to 1000; and y represents 0 to 900.

3. The photosensitive resin composition according to claim 2,
wherein the polybenzoxazole precursor is a polybenzoxazole precursor (F) obtained by reacting the polybenzoxazole precursor polymer (G) with a diazoquinone to partially cap hydroxyl groups with the diazoquinone:

wherein $Ar_1$, $Ar_2$ and $Ar_3$ are as defined in the polybenzoxazole precursor polymer (G);

x represents 5 to 1000;

y represents 0 to 900;

b represents 0 to 50; and

Z represents a diazoquinone group.

4. The photosensitive resin composition according to claim 1, which further comprises at least one of a diazoquinone compound and a dihydropyridine compound.

5. The photosensitive resin composition according to claim 1, which further comprises a solvent,
wherein the quinone diazide sulfonic acid ester of the phenol compound and the polybenzoxazole precursor are dissolved in the solvent.

6. The photosensitive resin composition according to claim 5,
wherein the solvent is at least one selected from the group consisting of N-methylpyrrolidone, γ-butyrolactone, N,N-dimethylacetamide, dimethyl-2-piperidone and N,N-dimethylformamide.

7. The photosensitive resin composition according to claim 1, which further comprises an adhesion promoter.

8. A method for manufacturing a semiconductor device comprising:
applying a photosensitive resin composition according to claim 1 onto a semiconductor element, so as to form a coated semiconductor element;
prebaking the coated semiconductor element;
exposing the prebaked semiconductor element;
developing the exposed semiconductor element; and
heating the developed exposed semiconductor element.

* * * * *